(12) United States Patent
Vanwiggeren

(10) Patent No.: US 8,841,923 B1
(45) Date of Patent: Sep. 23, 2014

(54) DEVICE AND METHOD FOR PERFORMING REMOTE FREQUENCY RESPONSE MEASUREMENTS

(75) Inventor: Gregory Douglas Vanwiggeren, San Jose, CA (US)

(73) Assignee: Agilent Technologies, Inc., Santa Clara, CA (US)

(*) Notice: Subject to any disclaimer, the term of this patent is extended or adjusted under 35 U.S.C. 154(b) by 913 days.

(21) Appl. No.: 12/847,057

(22) Filed: Jul. 30, 2010

Related U.S. Application Data

(63) Continuation-in-part of application No. 11/848,114, filed on Aug. 30, 2007, now Pat. No. 7,801,505.

(51) Int. Cl.
*G01R 23/02* (2006.01)

(52) U.S. Cl.
USPC .......................... 324/606; 324/612

(58) Field of Classification Search
None
See application file for complete search history.

(56) References Cited

U.S. PATENT DOCUMENTS

| | | | |
|---|---|---|---|
| 3,634,755 A | 1/1972 | Nicolson et al. | |
| 4,361,804 A | 11/1982 | Arnold | |
| 5,089,782 A | 2/1992 | Pike et al. | |
| 5,119,035 A | 6/1992 | Goy et al. | |
| 6,690,247 B2 | 2/2004 | Kintis et al. | |
| 7,071,852 B1 | 7/2006 | Wegener | |
| 7,219,037 B2 | 5/2007 | Pupalaikis et al. | |
| 7,251,199 B2 * | 7/2007 | Eidson | 368/46 |
| 7,379,395 B2 * | 5/2008 | Gage et al. | 368/118 |
| 7,518,353 B2 * | 4/2009 | Tanbakuchi et al. | 324/76.77 |
| 7,822,600 B2 * | 10/2010 | Kim | 704/207 |
| 2002/0063553 A1 * | 5/2002 | Jungerman | 324/76.24 |
| 2009/0216468 A1 | 8/2009 | Anderson | |

* cited by examiner

*Primary Examiner* — Arleen M Vazquez
*Assistant Examiner* — Feba Pothen

(57) ABSTRACT

A system for measuring a property of a device under test (DUT) includes a stimulus signal generator and a receiver. The stimulus signal generator generates a repetitive stimulus signal under control of a first clock, and provides the stimulus signal to an input port of the DUT. The receiver receives an input signal output from the DUT, the input signal being based on the stimulus signal provided to the input port of the DUT. The receiver includes a second clock syntonized with the first clock, a memory that stores a calibration measurement of a calibration stimulus signal provided to the receiver during a calibration period without the DUT being connected to the stimulus signal generator, and a data processor configured to determine the property of the DUT by comparing the stored calibration measurement with a measurement of the input signal from the DUT performed under control of the second clock.

20 Claims, 10 Drawing Sheets

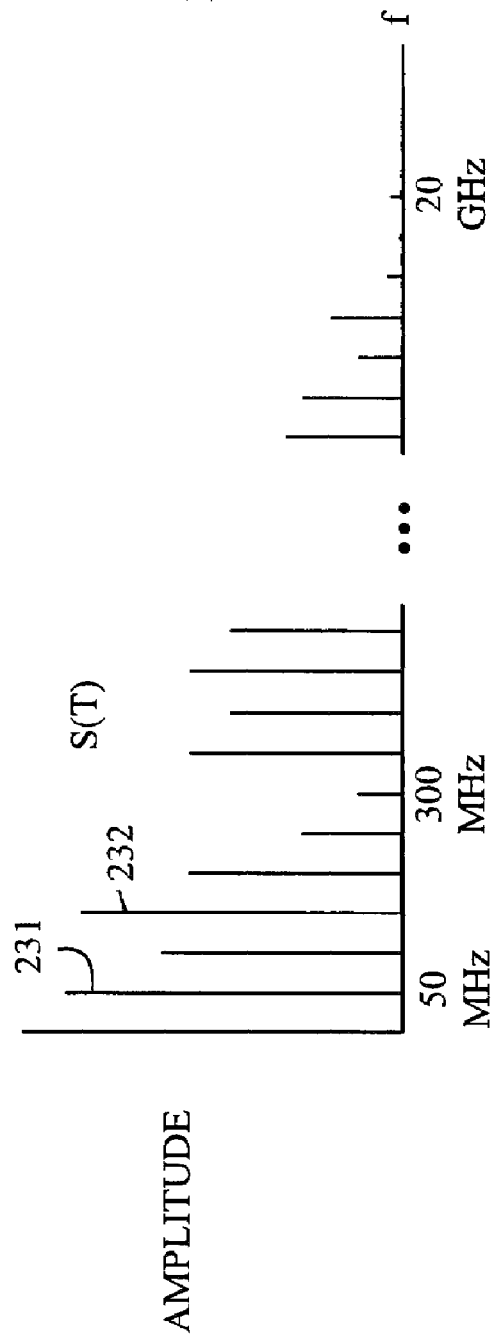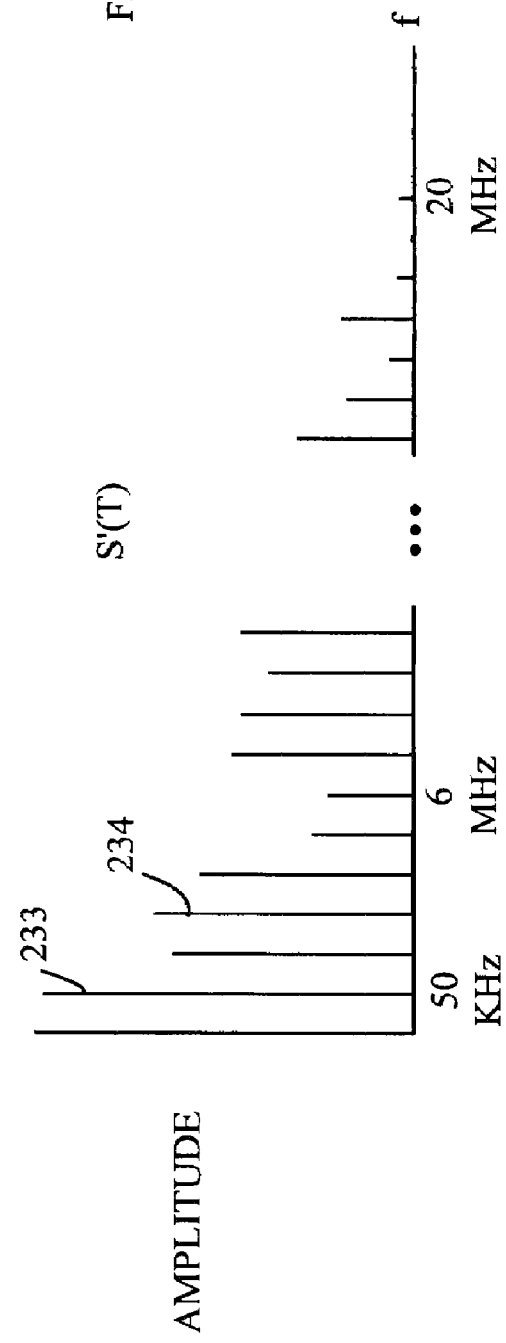

DEVICE AND METHOD FOR PERFORMING REMOTE FREQUENCY RESPONSE MEASUREMENTS

This application is a continuation-in-part of U.S. patent application Ser. No. 11/848,114, filed Aug. 30, 2007 and published as U.S. publication no. 2009/0061812 on Mar. 5, 2009, the subject matter of which is hereby incorporated by reference.

BACKGROUND

Many signals of interest have bandwidths that are much larger than the bandwidth of the test equipment utilized to measure the signals. For example, the bandwidth of a conventional oscilloscope is typically less than that of radio frequency (RF) signals used in communication systems and the like. Hence, measuring such signals on an oscilloscope presents a problem. A sampling oscilloscope circumvents this problem for repetitive signals by utilizing a sampling circuit that measures the signal over a very brief time interval and displays the resulting sample as one point of a graph. Typically, one sample is taken during each period of the repetitive signal. The time of the sample relative to the beginning of the signal repetition is varied in each period such that successive points sample the signal at different points relative to the beginning of each period of the signal. Hence, the collection of samples can be displayed to provide a conventional display of voltage as a function of time.

Only a small fraction of the energy in the signal is extracted at each sample. The amount of energy that is extracted depends on the time interval over which the sampling window is opened. The sampling window must be of sufficiently short duration that changes in the signal amplitude during the sampling interval can be ignored. Hence, as the bandwidth of the signal being measured increases, the sampling time interval must be decreased, leading to still further decreases in the amount of energy that is extracted from the signal. The ratio of this sample energy to the noise in the instrument determines the signal-to-noise ratio of the instrument. Higher signal-to-noise ratios provide more accurate measurements, and hence, are preferred.

In order to increase the signal-to-noise ratio of the sampled system, the repetition rate of the sampling may be increased. However, an increase in the sampling rate is not always practical, because the electronics following the sampler also have bandwidth limitations. Also, the amount of energy extracted from the signal may be improved by utilizing a mixer in which a sinusoidal local oscillator signal is used to extract energy from the signal. However, this approach is only practical for signals having limited bandwidth, such as a modulated RF carrier in which the carrier is removed, so that the modulation waveform can be examined.

In addition, test instruments, such as network analyzers and oscilloscopes, are designed to measure various properties of a device under test (DUT) in response to stimulus signals. Such properties include frequency response parameters of the DUT, including S-parameters, as well as reflectivity, group delay, dispersion, impulse response, nonlinear characteristics, electrical impedance, etc. Typically, test instruments have at least two ports to enable transmission measurements of the DUT, such as S21 and S12 measurements, where a first port receives the stimulus signal and a second port receives an input signal provided by the DUT responsive to the stimulus signal, so that the test instrument is able to compare the signals. However, transmission measurements may be difficult to obtain using a single test instrument when the DUT is relatively long and/or is difficult to access via both ports of the test instrument.

For example, it would be difficult to measure S21 and S12 of a 100 m long coaxial cable (the DUT) installed in a submarine. The length of the cable and its attenuation prevent accurate measurement of S21 by simply measuring the reflection off of the far end of the cable (as is sometimes done). With one test instrument, S21 may be measured by connecting yet another very long cable to the far end of the DUT and to the second port on the test instrument. However, this additional cable also has losses, which reduce the dynamic range of the measurement. Also, the effort expended in running this extra length of cable would make the measurement complicated and difficult to perform.

Alternatively, two network analyzers may be used to make the S21 measurement. Careful synchronization between the two network analyzers would enable measurement of the amplitude of S21, but not the phase. Phase cannot be measured because the phase of the transmitted signal would certainly vary in an unpredictable way relative to the phase of the receiver's local oscillator (LO) as the signal and LO are tuned, thus rendering the phase of the measurement ambiguous. Also, enabling the synchronization required for even the amplitude measurement typically involves a cable run between the two network analyzers, which makes this approach no more efficient than the previously discussed approach.

Channel sounding is another example of an application performed by test instruments. Channel sounding measurements are intended to characterize a signal path, including the S-parameters, between two or more antennas that may be located miles apart, where the signal path is considered the DUT. In multiple-input multiple-output (MIMO) applications, for example, multiple antennas are employed for both the transmitter and receiver ends of the DUT. The S-parameters of the "channel" between each pair of antennas is measured for MIMO channel sounding. Running cables between transmitter and receiver antennas is impractical for such long channels of the MIMO antenna arrays. Conventionally, S-parameter measurements may be recovered using large and expensive racks of instruments, one instrument rack for the transmitter and another instrument rack for the receiver. The transmitter and receiver instrument racks must be synchronized, e.g., using corresponding atomic clocks. Accordingly, making S-parameter measurements of long channels, e.g., defined by antennas widely separated in space, is expensive, complicated and time-consuming. Further, for high frequency signal, in particular, a high-speed oscilloscope (e.g., greater than 6 GHz) may be used to capture the receiver's data with sufficient bandwidth. However, such high-speed oscilloscopes are very expensive, costing tens of thousands of dollars.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 1 illustrates a frequency spectrum of repetitive input signal S(t).

FIG. 3 illustrates frequency components for compressed signal S'(t) generated from the input signal S(t) shown in FIG. 1.

DETAILED DESCRIPTION

Figure 2:
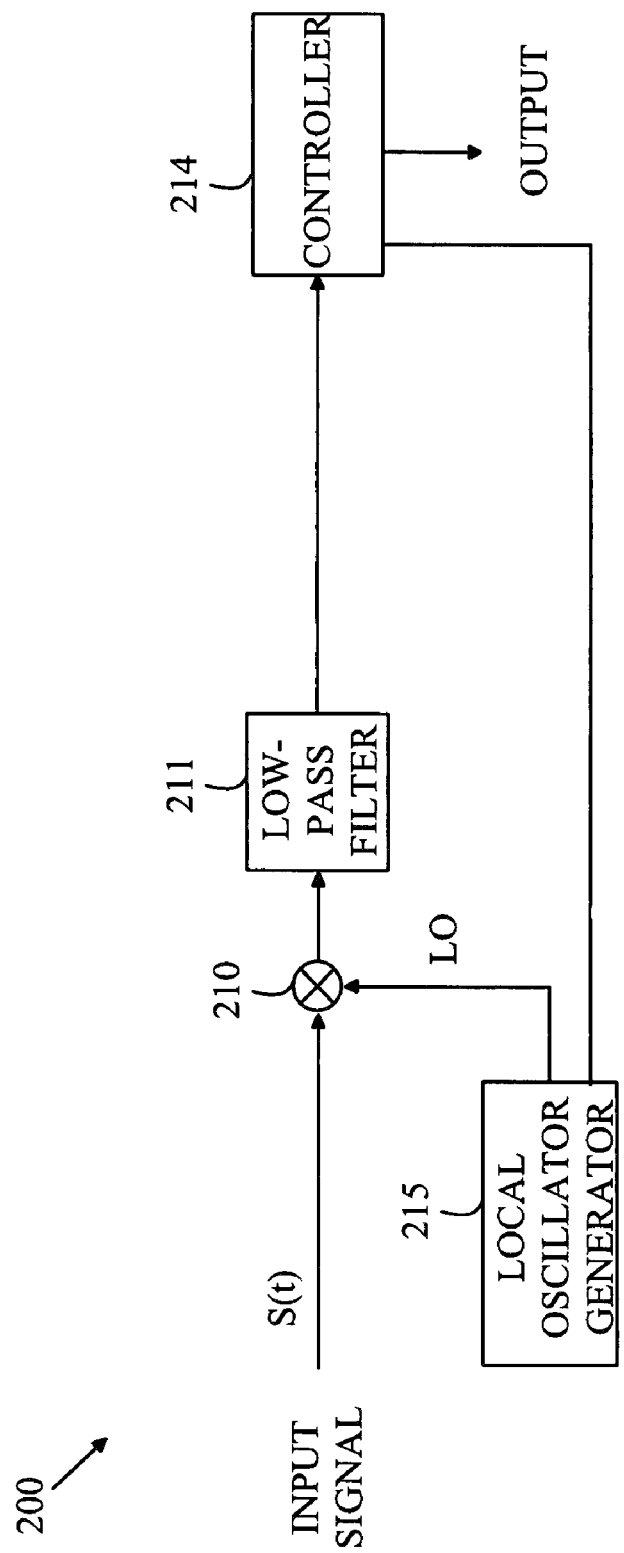
FIG. 2 is a block diagram illustrating a conventional receiver.

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Generally, various representative embodiments provide a system for measuring a property of a device under test (DUT). The system includes a stimulus signal generator and a receiver. The stimulus signal generator is configured to generate a repetitive stimulus signal under control of a first clock, and to provide the stimulus signal to an input port of the DUT. The receiver is configured to receive an input signal from an output port of the DUT, the input signal being based on the stimulus signal provided to the input port of the DUT. The receiver includes a second clock syntonized with the first clock, a memory configured to store a calibration measurement of a calibration stimulus signal provided to the receiver during a calibration period without the DUT being connected to the stimulus signal generator, and a data processor configured to determine the property of the DUT based on the stored calibration measurement and a measurement of the input signal from the DUT performed under control of the second clock.

Various representative embodiments further provide a method for measuring a property of a DUT using a repetitive stimulus signal. The method includes storing a measured calibration stimulus signal; receiving an input signal from an output of the DUT in response to the DUT receiving the stimulus signal from a stimulus signal generator, the stimulus signal generator generating the stimulus signal under control of a first clock; measuring the received input signal under control of a second clock that is not synchronized with the first clock; and determining the property of the DUT based on the measured input signal and the stored measured calibration stimulus signal.

Various representative embodiments further provide a device for measuring a property of a DUT using a repetitive stimulus signal provided by a stimulus signal generator under control of a first clock. The device includes a second clock syntonized with the first clock, local oscillator (LO) signal generator, a mixer, a low-pass filter, an analog-to-digital converter (ADC) and a data processor. The LO signal generator is configured to generate an LO signal under control of the second clock. The mixer is configured to mix the LO signal and an input signal output by the DUT in response to the stimulus signal provided to the DUT by the stimulus signal generator. The low-pass filter is configured to filter the mixed signal from the mixer to provide a frequency compressed signal. The ADC is configured to digitize the frequency compressed signal from the low-pass filter to provide a digitized signal. The data processor is configured to perform a Fourier transform on the digitized signal from the ADC, and to determine the property of the DUT by comparing the Fourier transformed signal with a previously stored calibration signal obtained by measuring the stimulus signal directly from the stimulus signal generator, without the DUT.

Various representative embodiments further provide a method of testing a DUT using a repetitive broadband stimulus signal having multiple harmonics. The method includes determining a resolution of the broadband stimulus signal based on a spectral mask limiting power corresponding to each of the harmonics, the resolution corresponding to a rate of repetition of the broadband stimulus signal. The method further includes applying the broadband stimulus signal having the determined resolution to the DUT; receiving an input signal from the DUT in response to the applied broadband stimulus signal; generating a periodic local oscillator (LO) signal having multiple harmonics corresponding to the harmonics of the broadband stimulus signal; mixing the LO signal with the input signal to create an intermediate frequency (IF) signal; and filtering the IF signal to provide a frequency-compressed signal having multiple harmonics, each of which corresponds to one of the harmonics in the input signal and has an amplitude related to an amplitude of the corresponding harmonic in the input signal. At least one frequency component in the filtered IF signal differs in amplitude or phase from a frequency component in the corresponding harmonic in the input signal. Also, power associated with each of the harmonics of the broadband stimulus signal is below the spectral mask.

FIG. 1 illustrates a representative frequency spectrum of unknown repetitive (periodic) input signal S(t), which has a fundamental frequency of 50 MHz and 400 harmonics, for example. The frequency spectrum consists of 400 peaks at frequency intervals of 50 MHz.

In many applications of interest, the goal is to compute amplitude and phase of the various harmonics. In principle, the harmonics could be obtained by digitizing the signal and performing a Fourier transform on the digitized signal. However, this strategy requires a system for sampling the signal at a frequency that is at least twice the frequency of the bandwidth of the signal. Such high-frequency sampling is not possible in many situations.

A receiver that utilizes such a mixing strategy is shown in FIG. 2, is a block diagram illustrating conventional receiver 200. To measure the first harmonic at 50 MHz, a local oscillator (LO) signal LO(t) signal having a frequency near 50 MHz (e.g., about 49 MHz) is introduced into one port of mixer 210 by local oscillator generator 215, and input signal S(t) is introduced into the other port. The output of mixer 210 is an intermediate frequency (IF) signal containing all of the cross products of input signal S(t) and LO signal LO(t). In particular, the output of the mixer 210 includes an IF signal having a frequency at 1 MHz. The amplitude of the IF signal is proportional to the amplitude of the 50 MHz harmonic in the input signal S(t). The output IF signal of the mixer 210 also includes a large number of other frequency components at frequencies higher than 50 MHz. Low pass filter 211 rejects these higher frequency components; hence, the filtered IF signal output by the low pass filter 211 is a sine wave having a frequency of 1 MHz and an amplitude that is proportional to the amplitude of the 50 MHz harmonic, and can be measured by controller 214. After the 50 MHz harmonic has been measured, the frequency of the LO signal LO(t) provided by the local oscillator generator 215 is changed to a frequency near the second harmonic at 100 MHz, and the procedure repeated until all harmonics have been measured. Therefore, to measure the entire frequency spectrum of the input signal S(t) over the harmonics of interest, 400 separate measurements must be made.

Accordingly, in order to measure S-parameters of a DUT at 400 frequency points spanning 20 GHz with a conventional network analyzer using the receiver 200 of FIG. 2, for example, two oscillators would have to be swept together through the frequency range. The first oscillator is used to apply a test signal to the DUT and the second oscillator is the LO (e.g., the local oscillator generator 215) of the mixer in the network analyzer. Sweeping the first and second oscillators in a synchronized manner, or stepping the first and second oscillators through 400 discrete steps, limits the speed of the measurement.

In addition, in many applications, the relative phases of the harmonics in the input signal S(t) must also be measured. Accordingly, the relative phases of the different LO signals LO(t) provided by the local oscillator generator 215 used to measure each harmonic must also be known. This further complicates the measurement of the input signal S(t) and increases the cost of the network analyzer.

According to various embodiments, the step-by-step process is avoided. In effect, a repetitive input signal S(t) is transformed to a new frequency compressed signal S'(t) having a bandwidth that is sufficiently limited to allow the compressed signal S'(t) to be digitized and Fourier transformed to obtain the frequency domain information of the input signal S(t), without requiring separate measurement of the individual frequency components in input signal S(t). FIG. 3 illustrates frequency components for the compressed signal S'(t) generated from the input signal S(t) shown in FIG. 1. Again, the input signal S(t) is assumed to have a fundamental frequency of 50 MHz, as shown at 231, and 400 harmonics of interest. The highest harmonic in the input signal S(t) is at 20 GHz. Compressed signal S'(t) also has 400 harmonics; however, the fundamental frequency of the compressed signal S'(t) is 50 KHz, as shown at 233, and hence the $400^{th}$ harmonic is only at a frequency of 20 MHz. The compressed signal S'(t) has one harmonic corresponding to each harmonic in input signal S(t). For example, the harmonic in the compressed signal S'(t) corresponding to harmonic 232 in the input signal S(t) is shown at 234. Also, as will be explained in more detail below, the relationship between the amplitudes and phases of the harmonics in the compressed signal S'(t) and the corresponding amplitudes and phases of the harmonics in the input signal S(t) can be determined, and hence, given the measured values for the amplitudes and phases of the harmonics in the compressed signal S'(t), the amplitude and phases of the harmonics in the input signal S(t) can be determined. As will be explained in more detail below, the bandwidth of the compressed signal S'(t) can be set such that the compressed signal S'(t) can be digitized and Fourier transformed using a relatively inexpensive analog-to-digital converter of average capability and conventional computational hardware.

Figure 4:
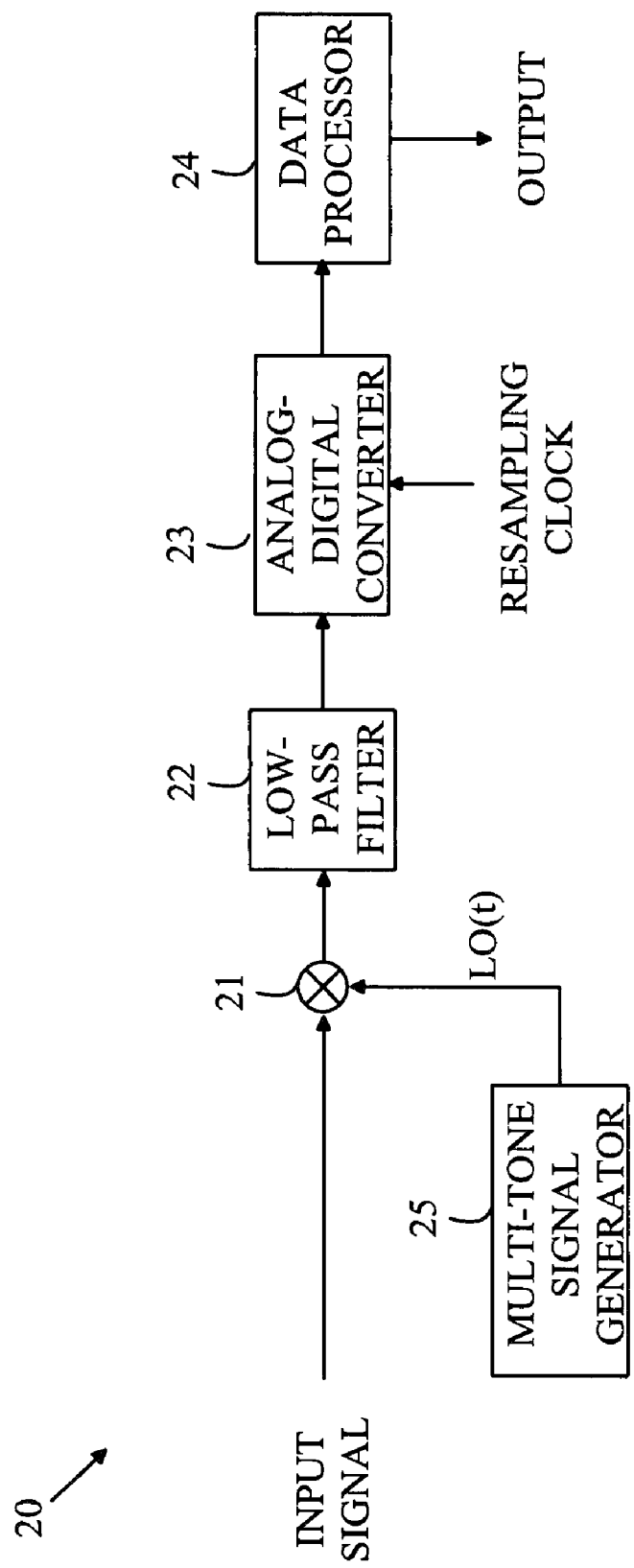
FIG. 4 is a block diagram illustrating a receiver, according to a representative embodiment.

FIG. 4 is a block diagram illustrating a receiver, according to a representative embodiment, which includes a multi-tone or multi-pulse local oscillator. Referring to FIG. 4, a repetitive input signal (e.g., input signal S(t)) is input to receiver 20, and mixed by mixer 21 with a repetitive LO signal LO(t) provided by multi-tone signal generator 25, discussed in more detail below. An IF signal output by the mixer 21 is filtered through low pass filter 22 and digitized by analog-to-digital converter (ADC) 23. The output of analog-to-digital converter 23 is processed by data processor 24 to produce a digitized replica of the input signal S(t) and/or measurements of the amplitude and phase of the input signal's frequency components. As will be explained in more detail below, the output of the low pass filter 22 is frequency compressed signal S'(t), provided the LO signal LO(t) from the multi-tone signal generator 25 is properly chosen. Further, it is understood that in various embodiments, the multi-tone signal generator 25 may be replaced by a multi-pulse generator as the LO signal generator, without departing from the scope of the present teachings.

For purposes of illustration, it may be assumed that the input signal S(t) is a repetitive signal with a period of $T_{in}$, and that the output of multi-tone signal generator 25 is also a repetitive signal with a period of $T_{LO}$, where $T_{LO}$ is slightly different from $T_{in}$, as discussed above. The input signal S(t) may be a broadband signal, for example, having a fundament frequency and several harmonics. In this case, both the input signal S(t) and the LO signal LO(t) can be represented as harmonic series of the following form:

$$S(t) = \sum_k A_k e^{(jkw_{in}t+\Phi_k)}$$

$$LO(t) = \sum_k B_k e^{(jkw_{LO}t+\Phi_k)}$$

Here, $j=\sqrt{-1}$, $\omega_{in}=2\pi/T_{in}$, $\omega_{LO}=2\pi/T_{LO}$, and the $\Phi_k$ and $\Phi_k$ are the phases of the $k^{th}$ harmonics in the input signal S(t) and the LO signal LO(t), respectively. The output of the mixer 21 is an IF signal containing all possible cross-products of the input signal S(t) and the LO signal LO(t). The low-pass filter 22 filters the IF signal and outputs the compressed signal S'(t) as the filtered IF signal, which can be written in the following form:

$$S'(t) = \sum_k B_k A_k e^{(jkw_c t + d\Phi_k) + \text{other frequency terms}}$$

Here $\omega_c = |\omega_{in} - \omega_{LO}|$. Hence, the compressed signal S'(t) will include a harmonic having frequency $k\omega_c$ corresponding to the harmonic having frequency $k\omega_{in}$ in the input signal S(t). The frequency of the highest harmonic of interest in the input signal S(t) may be denoted $N\omega_{in}$. Notably, each harmonic in the input signal S(t) will also be represented by other terms that have frequencies greater than $N\omega_c$. The unwanted higher frequency terms can be eliminated by the low pass filter 22. In general, the cutoff frequency of the low pass filter 22, C, is set such that $C > N\omega_c$. The upper limit on C is determined by the particular analog-to-digital converter 23 used.

As discussed above, the compressed signal, S'(t) can be viewed as a frequency compressed version of the input signal S(t), where the compression factor is $\omega_{in}/\omega_c$. All of the amplitude and phase information of each of the harmonics in the input signal S(t) can be obtained from the amplitude and phase of the corresponding harmonic in the compressed signal S'(t), provided the amplitudes and phase of the harmonics in the LO signal LO(t) are known. The fundamental frequency of the compressed signal S'(t) is $\omega_C$, and the phase of the $k^{th}$ harmonic of the compressed signal S'(t) is $d\Phi_k$. The constants $B_k$ and the phases associated with the tones in the LO signal LO(t) can be measured by applying a known input signal S(t) to the mixer 21, and measuring the amplitude and phase of each harmonic in the compressed signal S'(t). Hence, the Fourier transform of the output of the low-pass filter 22 can be used to obtain the amplitudes $A_k$ and the phases $\Phi_k$ of the input signal S(t).

The analog-to-digital converter 23 operates at a frequency that is sufficient to capture the frequency information in the compressed signal S'(t) output by the low-pass filter 22 without significant aliasing of higher frequency signals. Hence, it must at least sample the output of the low-pass filter 22 at a frequency twice the cutoff frequency of the low-pass filter 22. Since the analog-to-digital converter 23 samples the compressed signal S'(t) more than once per period of the LO signal LO(t), the analog-to-digital converter 23 captures more of the signal energy than a sampling oscilloscope, for example. In addition, the analog-to-digital converter 23 does not need to be synchronized to the LO signal LO(t).

The receiver 20 in the depicted embodiment may be used with any repetitive input signal S(t) (based on the stimulus signal). For example, the input signal S(t) may be a periodic pseudo-random binary sequence (PRBS) signal, although other types of repetitive signals may be incorporated. Also, in network analysis mode, the receiver 20 may be utilized to test both digital and analog components, circuits and networks.

Conventionally, one form of component testing involves measuring the response of the component (the DUT) to a repetitive (periodic) stimulus signal. In a simple case, the DUT is a linear device, and thus the signal leaving the DUT has the same frequency as the stimulus signal. In this case, the behavior of the DUT as a function of frequency can be measured by a conventional network analyzer by inputting a single stimulus signal tone to the DUT and measuring the output of the DUT at the frequency of the stimulus signal tone using an LO signal having a tone at a frequency close to that of the stimulus signal tone. The behavior of the DUT as a function of frequency can be obtained by sweeping the stimulus signal tone and the LO signal tone together. However, the time needed to sweep a large frequency range can be excessive in a conventional network analyzer. For example, the time required to sweep 20 GHz can be greater than 100 ms. This prevents the user from observing time-varying S-parameters on timescales faster than tens or hundreds of ms, for example.

In addition, a conventional network analyzer operating in swept mode has difficulty measuring DUTs that have large group delays for the stimulus signals passing through them. While these difficulties can be avoided by using a network analyzer that steps the input signal frequency through discrete steps, the resultant measurement time is increased still further over that obtained in the swept mode, and hence observation of time varying S-parameters is further limited.

A receiver according to various embodiments may be utilized to make such a measurement in a significantly shorter time period without the need to provide two swept frequency sources. For example, a multi-tone or multi-pulse stimulus signal having X harmonics may be applied to the DUT. Then, the signal output from the DUT is, in general, a multi-tone signal also having X harmonics, where the DUT output signal is the input signal S(t) provided to a mixer for mixing with an LO signal, as discussed above. For simplicity, it is assumed that the LO signal has one harmonic corresponding to each harmonic in the stimulus signal. A corresponding frequency compressed signal S'(t) having X harmonics is generated through a low-pass filter, having a spectrum that is analyzed to provide the amplitude and phase of each of the X harmonics in the compressed signal S'(t). As noted above, this information can then be used to compute the amplitude and phase of each of the harmonics in the output signal from the DUT. According to various embodiments, a receiver may be combined with a repetitive stimulus signal to provide a network analyzer that can operate at acquisition speeds significantly higher than conventional network analyzers, discussed above.

Figure 5:
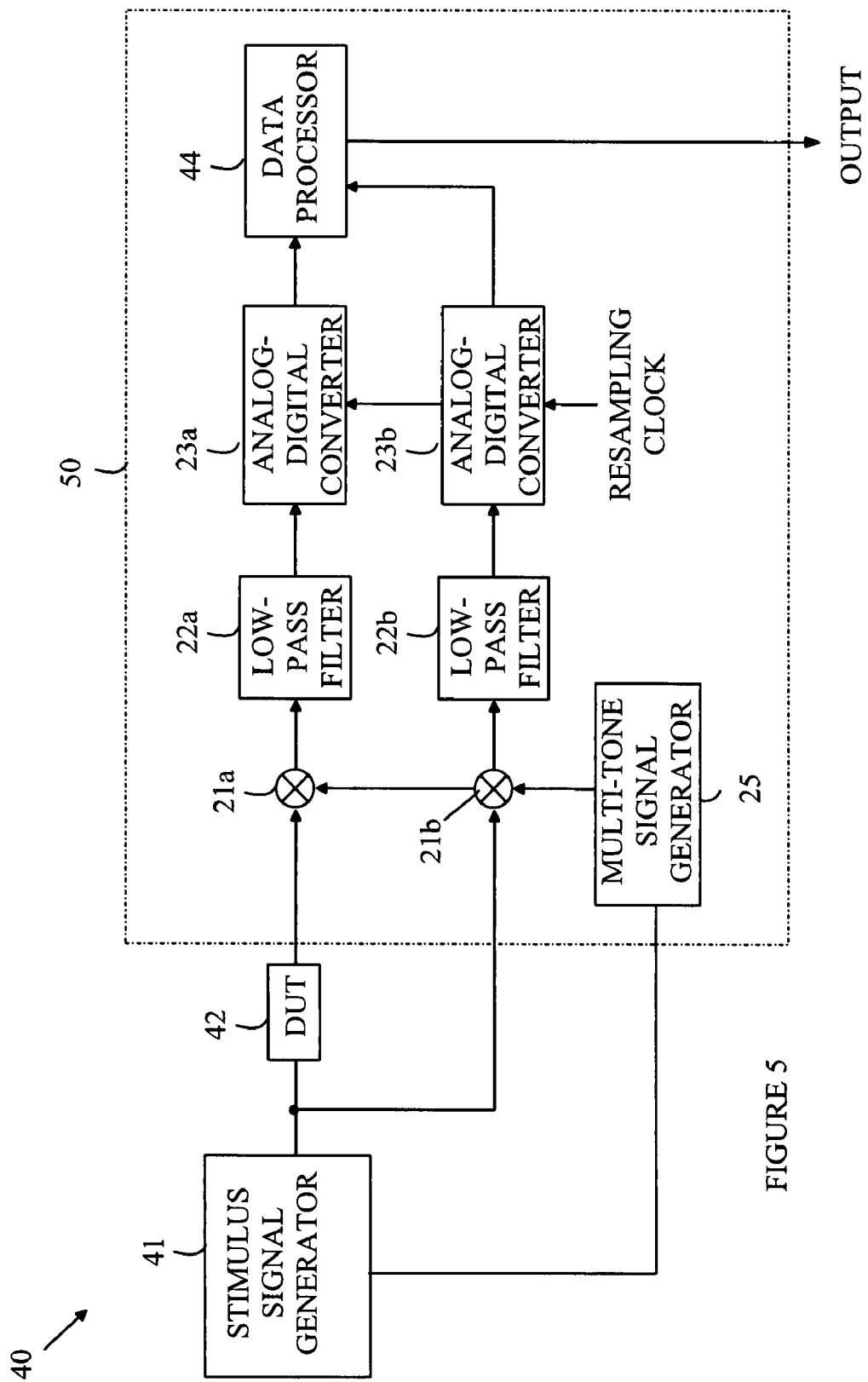
FIG. 5 is a block diagram illustrating a network analyzer, according to a representative embodiment.

FIG. 5 is a block diagram illustrating a network analyzer 40, according to a representative embodiment. Referring to FIG. 5, network analyzer 40 includes stimulus signal generator 41 that generates a repetitive stimulus signal having a fundamental frequency of $1/T_{in}$ and significant energy at each of multiple harmonics of the fundamental frequency. For example, the repetitive stimulus signal may be a periodic PRBS signal, although various other types of repetitive signals may be incorporated, without departing from the scope of the present teachings. The stimulus signal is applied to DUT 42, for example. The output of the DUT 42 is the input signal S(t) to be analyzed in receiver 50.

In the depicted representative embodiment, the receiver 50 includes a signal path that receives the input signal S(t) from the DUT 42 and a reference path that receives the stimulus signal directly from the stimulus signal generator 41. The signal path includes first mixer 21a, first low-pass filter 22a and first analog-to-digital converter 23a, and the reference path includes second mixer 21b, second low-pass filter 22b and second analog-to-digital converter 23b. The first and second mixers 21a and 21b may be identical to one another, and similarly, the first and second low-pass filters 22a and 22b may be identical to one another, for example.

An LO signal is generated by a multi-tone signal generator, depicted to as representative multi-tone signal generator 25, although it is understood that a multi-pulse generator may be incorporated for generating the LO signal without departing from the scope of the present teachings. The multi-tone signal generator 25 generates an LO signal having a fundamental frequency slightly different from that of the stimulus signal generated by the stimulus signal generator 41. The amplitudes and phases of the harmonics in the LO signal are known, and the phases of the harmonics in the LO signal may have a fixed relationship to the phases of the harmonics in the stimulus signal. The fundamental frequencies are chosen such that each harmonic in the LO signal corresponds to one of the harmonics in the stimulus signal.

A first IF signal from the first mixer 21a passes through the first low-pass filter 22a to provide a first frequency compressed signal $S_1'(t)$, which is digitized by the first analog-to-digital converter 23a. The digitized signal is Fourier transformed by data processor 44 to a first frequency-domain signal in a manner analogous to that discussed above. Hence, each peak in the Fourier spectrum represents a harmonic in the compressed signal. Similarly, a second IF signal from the second mixer 21b passes through the second low-pass filter 22b to provide a second frequency compressed signal $S_2'(t)$, which is digitized by the second analog-to-digital converter 23b. In the depicted embodiment, a resampling clock signal is provided to the analog-to-digital converters 23a and 23b. This clock causes the analog-to-digital converters 23a and 23b to digitize data at a rate equal to that of the resampling clock. The Nyquist limit requires that the sample rate of the analog-to-digital converters 23a and 23b (and thus the resampling clock frequency) be equal to or greater than twice the highest frequency of interest in the frequency compressed signals $S_1'(t)$ and $S_2'(t)$. Typically this is limited by the cutoff frequency of the low pass filters. The digitized signal from the second analog-to-digital converter 23b is also analyzed by the data processor 44 to provide a Fourier transformed second frequency-domain signal. The data processor 44 may compare the first and second frequency-domain signals to determine, for example, the frequency response of the DUT 42, including S-parameters and the like.

For example, the measurement of S21 as a function of frequency for the DUT 42 may be provided as follows. The stimulus signal generator 41 generates a stimulus signal having a fundamental frequency of 50 MHz and 400 harmonics having significant power, for example. The multi-tone signal generator 25 generates an LO signal having a fundamental frequency of 50.05 MHz and 400 corresponding harmonics. At 20 GHz, i.e., the $400^{th}$ harmonic, the corresponding tones in the stimulus and LO signals differ by 20 MHz. Hence, if the first and second low pass filters 22a, 22b each have a 25 MHz cutoff, for example, first and second frequency compressed signals $S_1'(t)$, $S_2'(t)$ (i.e., corresponding to the first and second IF signals) representing each of the 400 harmonics will appear in the output of each of the low pass filters 22a, 22b, which are digitized by the first and second analog-to-digital converters 23a, 23b. The Fourier transform of each of the first and second frequency compressed signals $S_1'(t)$, $S_2'(t)$ will have a frequency peak every 0.05 MHz from 0.05 MHz to 25 MHz. The first peak corresponds to the stimulus signal harmonic at 50 MHz, the second peak to the harmonic at 100 MHz, and so on. The peaks in the Fourier transform of the first compressed signal $S_1'(t)$ (corresponding to the first IF signal) from the first analog-to-digital converter 23a may be denoted by $IF_D(f_k)$, for k=1 to X, and the peaks in the Fourier transform of the second (reference) compressed signal $S_2'(t)$ (corresponding to the second IF signal) from the second analog-to-digital converter 23b may be denoted by $IF_R(f_k)$, for k=1 to X, then $S_{21}(f_k)=IF_D(f_k)/IF_R(f_k)$, where $S_{21}(f_1)$ is $S_{21}$ at 50 MHz, $S_{21}(f_2)$ is $S_{21}$ at 100 MHz, and so on.

The above example assumes that the first and second mixers 21a, 21b are identical, and that differences in cables and signal/reference paths can be ignored. If this is not the case, the effects of differences in the signal and reference paths can be calibrated and eliminated by making a second set of calibration measurements with the DUT 42 replaced by a calibration standard.

The time required to make the measurement in question depends on the speed of analog-to-digital converters 23a, 23b. For example, even a relatively slow, inexpensive analog-to-digital converter running at 100 Msamples/sec. with up to 16 bits resolution is able to acquire 512 frequency measurements over the IF band in only about 10 microseconds. The equivalent measurement with a conventional network analyzer requires about 100 ms. The speed advantage arises from the fact that the multi-tone LO signal enables the frequency spectrum to be sampled over a wide range without having to sweep an oscillator through a 20 GHz range.

A receiver according to various embodiments may also be utilized to construct a sampling oscilloscope. Conventional real-time oscilloscopes are too slow to measure signals at very high frequencies. The bandwidth of such oscilloscopes is limited to less than half the sampling rate of the analog-to-digital converter employed in the oscilloscope. Hence, while such oscilloscopes can measure arbitrary waveforms, they are not usable for very high frequency signals. A sampling oscilloscope, on the other hand, may be used for very high frequency signals provided the input signals are repetitive. A sampling oscilloscope samples the input signal at intervals that are displaced from the beginning of the repetitive waveform being measured. In the simplest case, the input signal is sampled once each period of the repetitive signal. If the period of the repetitive input signal is T, the input signal is sampled at T+kt, where k is an integer that runs from 0 to $N_{p-1}$. Hence, if the input signal is to be measured at $N_p$ points with one point being measured per period, then $t=T/N_p$, and the time to generate a digital replica of the signal is $N_pT$. In principle, the measurement time can be reduced by measuring more than one point per period of the unknown signal.

Figure 6:
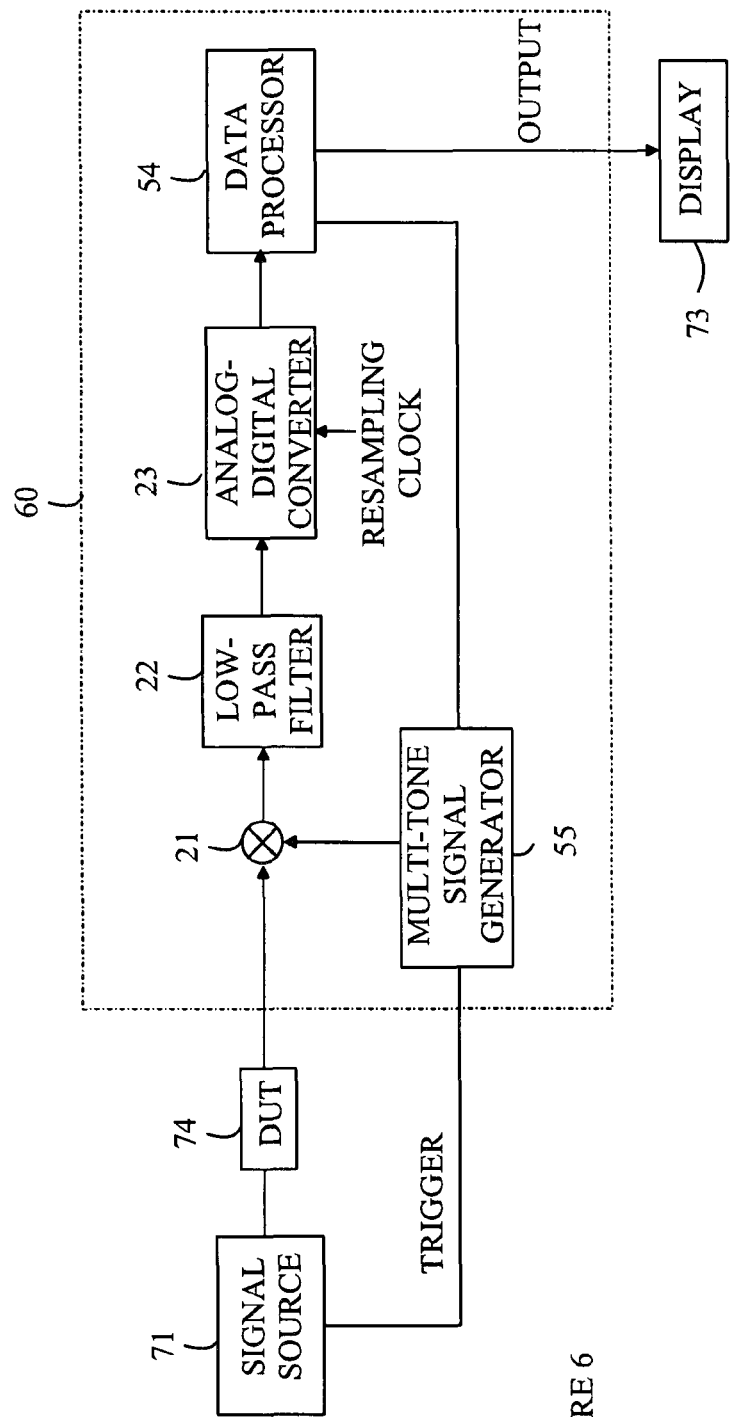
FIG. 6 is a block diagram illustrating a sampling oscilloscope, according to a representative embodiment.

FIG. 6 is a block diagram illustrating a sampling oscilloscope, according to a representative embodiment. Referring to FIG. 6, sampling oscilloscope 60 generates an output, which is a digital replica of an input signal provided by signal source 71. The output can be displayed on a display device, such as display 73, for example, or used as input to another data processing system. In general, the signal source 71 provides an input stimulus signal having a repetitive waveform and some form of trigger that is synchronized with the stimulus signal. For the purposes of discussion, it will be assumed that the stimulus signal is applied to DUT 74, which provides input signal S(t) to be input to the sampling oscilloscope 60 and displayed on the display 73.

The repetitive waveform stimulus signal generated by the signal source 71 has a period that may be denoted by $T_s$. The output of the DUT 74 in response to the stimulus signal, which is the input signal S(t) to the sampling oscilloscope 60, will also have a repetitive waveform with the period $T_s$, and may be represented by a harmonic series. Once again, it will be assumed that the input signal S(t) from the DUT 74 is bandwidth limited, i.e., there is some number of harmonics, X, such that the frequency band below $X\omega_{in}$ includes essentially all of the energy in the input signal S(t). The amplitude and phases of these X harmonics are measured by the sampling oscilloscope 60, and used to construct a replica of the input signal S(t) from the DUT 74 by means of an inverse Fourier transformation. Since the purpose of a sampling oscilloscope is to recreate the input signal S(t), X is typically equal to the highest harmonic of interest of the stimulus signal, N.

To provide the measurements of the amplitude and phase of the X harmonics, multi-tone signal generator 55 must generate an LO signal that has a harmonic sufficiently close to each of the X harmonics of the input signal S(t), such that the mixing product (IF signal) falls within bandwidth C of low pass filter 22. Of course, it is understood that in various embodiments, the multi-tone signal generator 55 may be replaced by a multi-pulse generator as the LO signal generator, without departing from the scope of the present teachings. As discussed above, the low pass filter 22 outputs a frequency compressed signal S'(t). The phases and amplitudes of the X harmonics of the input signal S(t) must be obtainable from the phases of the compressed S'(t). As will be discussed in more detail below, the phases of the tones in the LO signal are locked with respect to one another. Hence, the digitized signal output by analog-to-digital converter 23 will include both the phase and amplitude information needed to determine the phase and amplitude of the harmonics in the input signal S(t). Hence, a replica of the input signal S(t) can be provided by an inverse Fourier transform generated by data processor 54.

The above-described embodiments utilize a multi-tone signal generator (or a multi-pulse signal generator) that provides a repetitive LO signal having the desired harmonics. In general, the amplitude of the harmonics must be controllable, since the amplitude of each frequency component from the mixer is proportional to the amplitude of a corresponding harmonic in the multi-tone LO signal. In addition, at least one harmonic of the LO signal must be sufficiently close to each harmonic in the input signal that the frequency of the mixing product falls within the available bandwidth C of the low pass filter.

Figure 7:
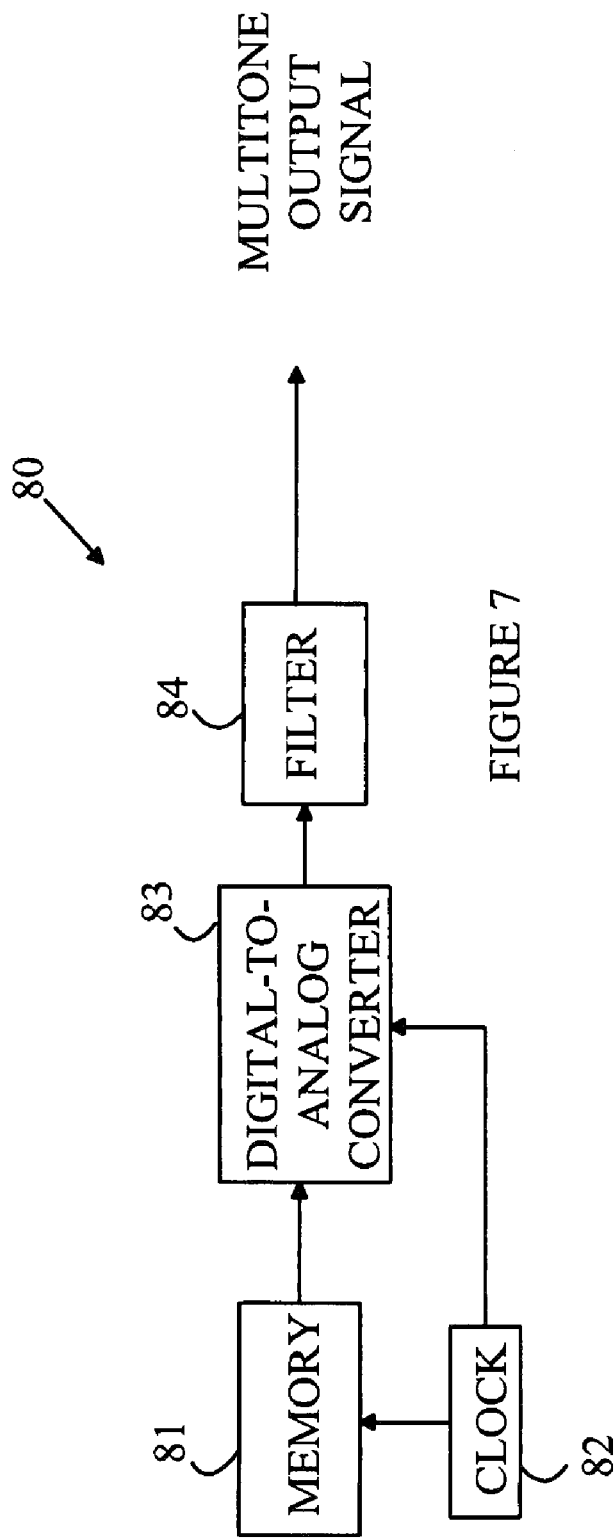
FIG. 7 is a block diagram illustrating a multi-tone signal generator, according to a representative embodiment.

A multi-tone signal of the desired frequency spectrum and phase relationships may be synthesized digitally by generating each sine wave numerically and mathematically adding the individual sine waves with the desired amplitudes and phases. For example, FIG. 7 is a block diagram illustrating a multi-tone signal generator 80 utilizing this approach, according to a representative embodiment. Referring to FIG. 7, the numerically generated digital signal is stored in memory 81 as a sequence of amplitudes, the address of each amplitude specifies the order in which the value is to be read out of the memory 81. The address of the memory 81 is supplied by clock 82 that sequentially updates an address register (not shown) in the memory 81 and causes the value stored at the location specified by the address to be output to digital-to-analog converter 83. The clock 82 also triggers the digital-to-analog converter 83, causing the digital-to-analog converter 83 to output a voltage corresponding to the digital input. The output of the digital-to-analog converter 83 is then filtered by filter 84 to smooth out the steps. By adjusting the time period of the clock 82, a repetitive signal of the desired period can be obtained.

To provide a multi-tone signal with harmonics in the tens of GHz, for example, the digital-to-analog converter 83 must be capable of converting values at a rate of tens of GHz. Digital-to-analog converters having such high conversion rates are either not available or too costly for many applications of interest. Hence, at very high frequencies a different form of multi-tone signal generator is preferred.

One type of signal that can be generated digitally at rates significantly above those obtainable using digital-to-analog converters is a multi-pulse signal generator, as mentioned above. The multi-pulse signal generator produces a repetitive waveform of period $T_{LO}$ consisting of a binary signal that switches between two voltages, V1 and V2, multiple times in the period $T_{LO}$. For the purposes of this discussion, a multi-pulse signal is defined to be a signal that takes on one of two voltages at any given time, except for the times at which the signal is transitioning between these two values.

Figure 8:
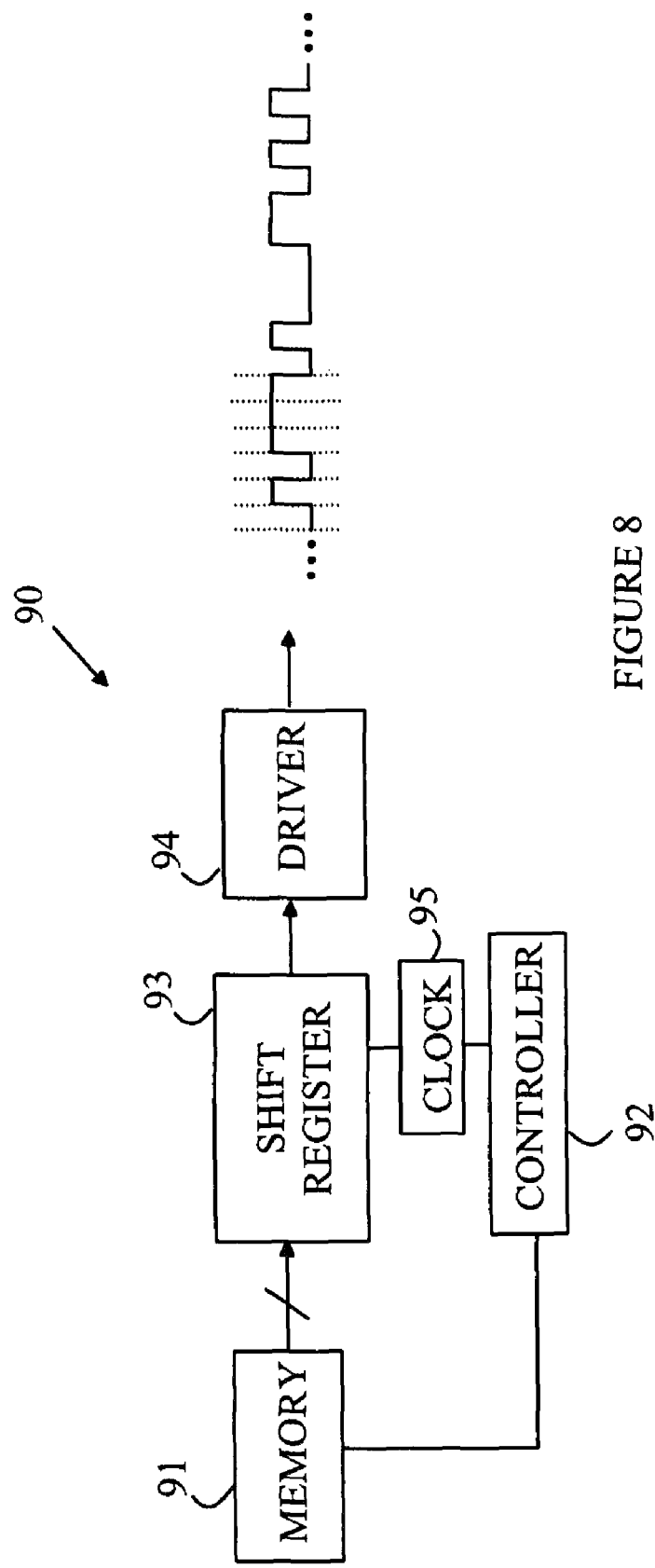
FIG. 8 is a block diagram illustrating a multi-pulse signal generator, according to a representative embodiment.

FIG. 8 is a block diagram illustrating a multi-pulse signal generator 90 utilizing this approach, according to a representative embodiment. Referring to FIG. 8, a multi-pulse signal is specified by a sequence of bits stored in memory 91. To improve the speed of the multi-pulse signal generator 90, the sequence is divided into multi-bit words within the memory 91. Each word is transferred in parallel to high-speed multiplexer 93 when the previous contents of the multiplexer 93 have been read out. At each clock pulse, the multiplexer 93 selects the next bit of the parallel input word in sequence, and transfers it to the output of the multiplexer 93. The output of the multiplexer 93 is input to driver 94, which converts the binary value to a voltage, binary 0 being converted to V1 and a binary 1 being converted to V2, for example. In an embodiment, the multiplexer 93 may be implemented via a shift register, for example, that is shifted on each clock cycle from clock 95 under control of controller 92.

The maximum speed of the multi-pulse signal generator 90 is determined by the rate at which bits can be read out of the multiplexer 93. Generally, multiplexers capable of operating at tens of GHz are commonly used in telecommunication switches. Therefore, the multi-pulse signal generator 90 may be constructed at a relatively low cost, while still providing signals with harmonics in the tens of GHz. Since this rate is significantly higher than the rate at which digital-to-analog converters can operate, the multi-pulse signal generator 90 enables the mixer to operate at higher signal input frequencies than would be possible with a conventional multi-tone signal.

It should be noted that a multi-pulse signal differs from a single-pulse signal in that a single-pulse signal produces a spectrum in which the fundamental frequency and all its harmonics have the same phase and have amplitudes that cannot be controlled, whereas a multi-pulse signal produces a spectrum with arbitrary amplitudes and phases. In this regard, the multi-pulse signal and the multi-tone signal are similar, in that they are both signals having a fundamental frequency and one or more higher harmonics with arbitrary amplitudes and phases.

Further, the number of harmonics in a multi-pulse signal is determined by the number of bits in the binary sequence that determines the multi-pulse signal. The frequency of the harmonics is determined by the clock rate with which the bits are output. If the multi-pulse signal is clocked at a frequency f and has P pulses in the sequence, the fundamental frequency of the LO signal will be f/P. The specific pattern of bits determines the relative amplitudes and phases of the harmonics.

A number of techniques may be employed to generate such patterns without departing from the scope of the present teachings. For example, assume that the desired amplitudes and phases of the various harmonics are known, the amplitudes and phases may be denoted by $B_k$ and $\Phi_k$, respectively, for k=1 to M. A combined digital signal D(n) is given by the following, in which n runs from 1 to Y, the number of points in one cycle of the multi-tone digital signal:

$$D(n) = \sum_k B_k \sin(knt_0 + \Phi_k)$$

Here, $t_0$ is a constant that is chosen to provide the desired frequency resolution in the combined digital signal D(n). The combined digital signal D(n) is then converted to a multi-pulse signal, P(n) by setting P(n)=1 when D(n)>0 and P(n)=0 when D(n)≤0. The frequency spectrum of P(n) can be shown to be approximately that of D(n). The differences introduced by the approximation change the calibration constants described above.

In many cases, a specific relationship between the phases, $\Phi_k$, is not required. If the multi-pulse signal is utilized to probe frequency response of the device as discussed above, then the individual harmonics in the multi-pulse signal are treated separately in the analysis, and hence, the specific phase relationships between the harmonics in the multi-pulse signal do not enter into the analysis. In this case, the phases can be chosen such that the multi-pulse signal has less energy in harmonics that are different from the harmonics of interest.

The above-described embodiments utilize a mixer configuration in which there is one harmonic in the LO signal for each harmonic of interest in the input signal. However, in the more general case, the number of harmonics in the LO signal may be more or less than the number of harmonics of interest in the input signal.

For example, consider a case in which the input signal has a fundamental frequency of 1 MHz and 20,000 harmonics, i.e., the highest harmonic in the input signal (e.g., input signal S(t)) is 20 GHz. Assume that the low pass filter has a cutoff frequency of 50 MHz. Consider an LO signal having a fundamental frequency of 40.001 MHz. The fundamental frequency will generate components of a frequency compressed signal (e.g., compressed signal S'(t)) with frequencies that correspond to the differences and sums of the harmonics of the input signal and 40.001 MHz. In particular, there will be frequency components in the compressed signal S'(t) at 39.001, 38.001, . . . , etc., 0.001 MHz corresponding to the harmonics at 1 MHz, 2 MHz, . . . 40 MHz, respectively, in the input signal S(t) and components at 41.001, 42.001, . . . , 49.001 corresponding to the harmonics at 1 MHz, 2 MHz, . . . 9 MHz in the input signal S(t), respectively. The next harmonic in the LO signal, 80.002 MHz, will generate frequency components at 49.002, 48.002, . . . , etc., 0.002 MHz corresponding to the input signal harmonics at 31 MHz, 32 MHz, . . . , 80 MHz, respectively. Hence, it can be seen that each harmonic in the LO signal now generates a group of frequencies in the compressed signal S'(t). In addition, if the fundamental of the LO signal harmonics is correctly chosen, the group of frequencies generated by any given harmonic will be distinct from those generated by other harmonics in the LO signal.

To create a frequency compressed signal S'(t) that has components corresponding to each of the harmonics of interest in the input signal S(t), the harmonics in the LO signal must have certain properties. First, the harmonics of the LO signal should not have frequencies equal to any of the harmonics of interest in the input signal S(t). If a harmonic in the input signal S(t) matches a harmonic in the LO signal, that harmonic will be lost, since the corresponding harmonic in the compressed signal S'(t) would have a frequency of zero. Second, the group of frequency components in the compressed signal S'(t) generated by the $k^{th}$ harmonic in the LO signal must have frequencies that differ from the group of harmonics generated by the $j^{th}$ harmonic in the LO signal for values of k and j that are different from one another. These constraints will be satisfied if $i\omega_{LO} \neq j\omega_{in}$ for i=1 to M, and j=1 to X, where $X\omega_{in}$ is the frequency of the highest non-negligible harmonic in the input signal S(t), and $M\omega_{LO}$ is the frequency of the highest harmonic in the LO signal. It should be noted that $\omega_c$ is the minimum value of $|i\omega_{LO}-j\omega_{in}|$ for i and j in the above defined ranges if this constraint is satisfied.

The above-described embodiments depend on a low pass filter that rejects the high frequency mixing products that are produced by the mixer. The cut-off frequency of the low pass filter must be sufficient to allow the frequency components of the compressed S'(t) to be transmitted to the analog-to-digital converter. However, filters with larger pass bands may be utilized, without departing form the scope of the present teachings. For example, a larger pass band reduces the number of harmonics in the LO signal that must be utilized to assure that all of the harmonics of interest in the input signal S(t) are represented in the compressed signal S'(t). Hence, larger pass bands have advantages in some applications. However, there is a tradeoff between the pass band of the filter and the cost of the analog-to-digital converter. The analog-to-digital converter must be able to sample the signal leaving the filter at a frequency equal to twice the pass band of the filter; hence, a larger pass band requires a faster analog-to-digital converter. If the pass band is too great, the cost of the analog-to-digital converter becomes prohibitive for many applications.

In the examples discussed above, there is one frequency component in the compressed signal S'(t) for each harmonic of interest in the input signal S(t). However, depending on the particular LO signal utilized, some of the harmonics in the input signal S(t) may be represented by more than one harmonic in the compressed signal S'(t). That is, the compressed signal S'(t) may have more than N harmonics. The additional components can be ignored or utilized to provide an improved estimate of the amplitude and frequency of the corresponding harmonic in the input signal S(t).

The manner in which any particular harmonic in the input signal S(t) is mapped to one or more harmonics in the compressed signal S'(t) by a particular LO signal can be ascertained by a calibration procedure. In one representative procedure, a calibration signal with a known complex frequency spectrum RFcal(f) is utilized as an input to the mixer. The complex frequency spectrum of the output of the low pass filter when this calibration signal is used may be denoted as input by IFcal(f). The output complex frequency spectrum of the output of the low pass filter when the unknown signal is input to the mixer may be denoted by IF(f). Then, the complex frequency spectrum of the unknown signal, RF(f), is given by RF(f)=IF(f)*RFcal(f)/IFcal(f).

In the above-described embodiments, the number of harmonics of interest in the input signal S(t) is greater than the number of harmonics that are used to map the input harmonics into the compressed signal S'(t). However, embodiments in which the number of harmonics in the LO signal is greater than the number of harmonics of interest in the input signal can also be constructed.

The mixer(s) utilized in the above-described embodiments of may be any conventional mixer having the required frequency response. A sampling switch, such as the type used in a sampling oscilloscope, may also be utilized as a mixer in embodiments that utilize a multi-pulse signal. For example, the sampling switch may be defined to be any device that passes a signal when a control terminal on the device is at a first voltage and blocks the signal when the control terminal is at a second voltage. The multi-pulse signal discussed above is a signal that switches between two such voltages. A sampling switch with its control terminal connected to the multi-pulse signal can be used in place of the mixers discussed above. The control terminal serves as the LO input to which the multi-pulse is applied. The input signal is applied to the input of the switch, and the low pass filter is connected to the output of the switch.

The output of the sampling switch is the input signal S(t) multiplied by some constant factor when the switch is open and zero when the switch is closed. A mixer with an LO signal that switches between 0 and some constant non-zero potential likewise generates a signal that is the input signal S(t) multiplied by a constant when the LO signal is at the constant non-zero potential and zero when the LO signal is at 0. Hence, it can be seen that the mixer may be replaced by a switch if the LO signal is a multi-pulse signal, without departing from the scope of the present teachings. It should be noted that if the multi-pulse signal is replaced by an arbitrary repetitive signal, the output of the sampling switch can still be used to provide the IF signal provided appropriate calibration measurements are made of the output of the sampling switch with known input signals.

It should also be noted that the above-described embodiments have been described in terms of an "ideal" mixer. That is, a device receives an input signal and an LO signal and generates an output signal that is the product of the input signal and the LO signal. However, less than ideal mixing devices can also be utilized. Consider an input signal having a highest harmonic of interest, N, that is input to a circuit that receives an LO signal having M harmonics and generates an output signal, where M denotes the highest non-negligible harmonic in the LO. It will be presumed that there are M harmonics in the LO. Consider the $j^{th}$ harmonic of the input signal and denote the frequency of this harmonic by $^{in}\omega_j$. Similarly, the $m^{th}$ harmonic of the LO signal may be denoted by $^{LO}\omega_m$. If, for each harmonic of interest in the input signal, the output signal has a corresponding frequency component $^{out}\omega_k$, where $^{out}\omega_k = |^{in}\omega_j - ^{LO}\omega_m|$ for some choice of j between 1 and N and m between 1 and M, and the amplitude and phase of the frequency component $^{out}\omega_k$ can be written in terms of the amplitudes and phases of the harmonics of the LO signal and the harmonics of the input signal, then the circuit can be used in various embodiments even when it provides additional frequency terms or when the amplitudes of the output harmonics are not linear functions of the amplitudes of the input harmonics and amplitudes of the LO harmonics. For the purposes of discussion, the term "mixer" may be defined to include such circuits. For example, the term mixer may include a sampling switch, as described above.

The above-described embodiments generate a frequency compressed signal S'(t) in which the frequency components of interest output from a low-pass filter are equally spaced. In principle, the frequencies of the LO signal are chosen such that these frequency components are not equally spaced. However, such embodiments require more complex data analysis.

It should be noted that while the input signal S(t) is assumed to have a highest harmonic of interest, N, one or more of the harmonics below N in the input signal S(t) could have zero amplitude. In this case, the corresponding harmonic in the compressed signal S'(t) will also have an amplitude of zero.

As discussed above, network analyzers are used to measure various stimulus responses and properties, including S-parameters, of DUT. When the DUT is particularly long, however, it is difficult to physically connect the two ports of a network analyzer to receive both the stimulus signal provided to an input port of the DUT and the signal output from an output port of the DUT to enable comparison of the two signals, for example, to measure S-parameters of the DUT. For example, referring to the embodiment depicted in FIG. 5, if DUT 42 were very long medium, such as a cable or a wireless channel between transmitter and receiver, then it would be difficult for the stimulus signal generator 41 to provide an input to both the DUT 42 and the second mixer 21b, since they will be separated by a large physical distance.

Figure 9:
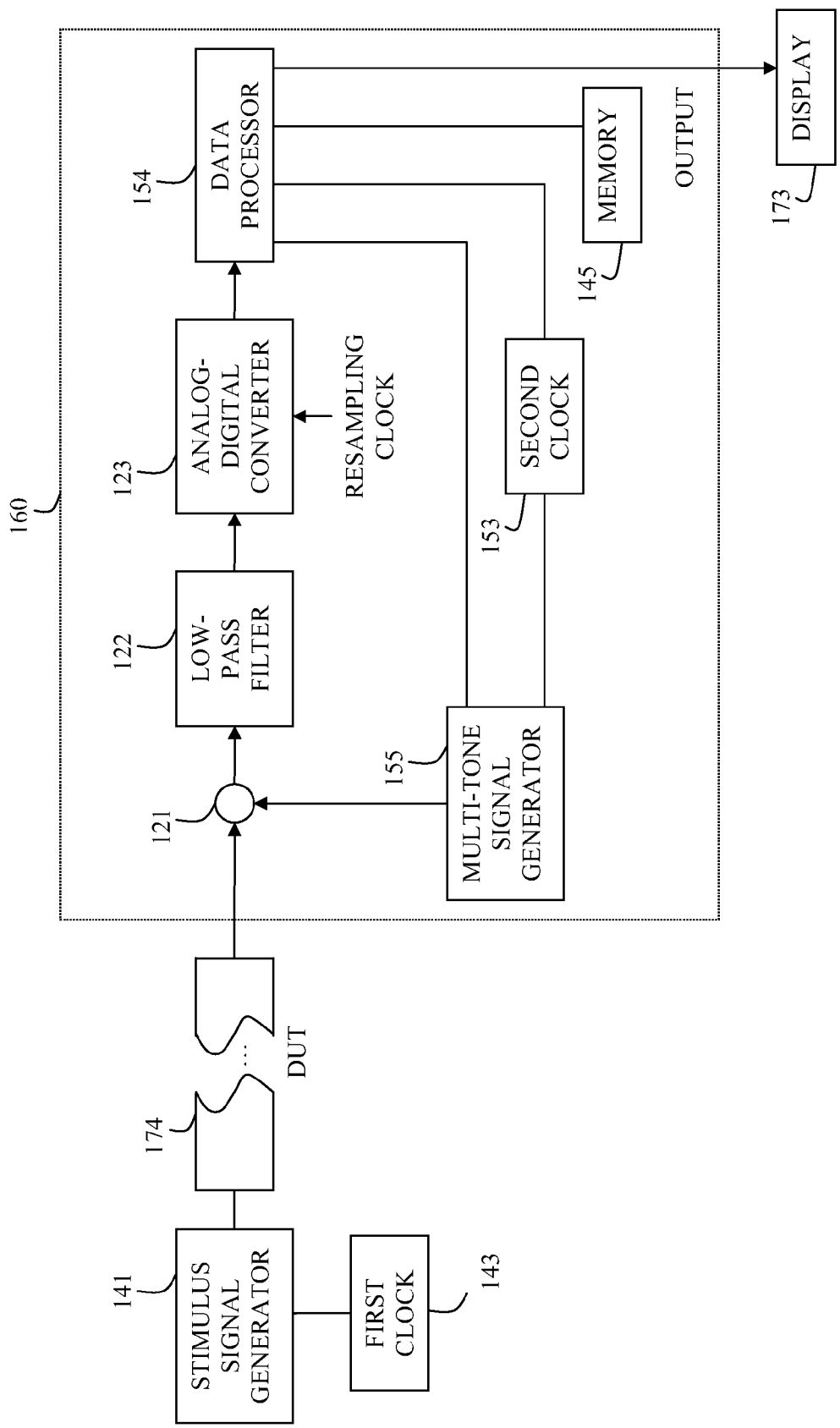
FIG. 9 is a block diagram illustrating a distributed test instrument including a remote receiver for determining DUT properties, according to another representative embodiment.

FIG. 9 is a block diagram illustrating a distributed test instrument including a remote receiver, such as a sampling oscilloscope, according to a representative embodiment, for measuring properties of a DUT having an input and an output separated by a large distance. Referring to FIG. 9, stimulus signal generator 141 generates a repetitive stimulus signal, such as a periodic PRBS signal, for example, having a fundamental frequency of $1/T_{in}$ and significant energy at each of multiple harmonics of the fundamental frequency. The stimulus signal is generating using first clock 143 and is applied to DUT 174. The output of the DUT 174 is the input signal S(t) to be analyzed in receiver 160. The stimulus signal provided to the DUT 174 and the analysis of the output of the DUT 174 may be implemented using various devices and/or processing systems, without departing from the scope of the present teachings.

In the depicted embodiment, the DUT 174 is physically long, such that an input of the DUT 174, which receives the stimulus signal from the stimulus signal generator 141, is physically distant from an output of the DUT 174, which outputs the input signal S(t) received by the receiver 160. For example, the DUT 174 may be a long coaxial cable, where the input and output correspond to the opposite ends of the cable. Also, the DUT 174 may not be an actual device, per se, but may represent a signal path or channel between two antennas in a MIMO wireless communication network, for example, where the input corresponds to a first (transmitting) antenna and the output corresponds to a second (receiving) antenna. It is understood, however, that the various embodiments apply to various different the types of DUT 174.

In the depicted representative embodiment, the stimulus signal generator 141 has no direct connection to the receiver 160 while the stimulus response of the DUT 174 (input signal S(t)) is being measured, e.g., due to the extensive distance between the input and output of the DUT 174. For example, unlike the sampling oscilloscope 60 shown in FIG. 6, there is no connection for a trigger between the stimulus signal generator 141 and the multi-tone signal generator 155 for synchronizing generation of the LO signal. In other words, the stimulus signal generator 141 is remotely located from the receiver 160 during the actual testing, making physical connections (e.g., via cable) or other means for providing direct synchronization with the stimulus signal generator 141 impractical.

In the depicted embodiment, the receiver 160 includes at least substantially the same components as the sampling oscilloscope 60 in FIG. 6. For example, the receiver 160 includes multi-tone signal generator 155 for generating an LO signal that has a harmonic sufficiently close to each of the X harmonics of the input signal S(t) provided by the DUT 174, such that the mixing product (IF signal) of mixer 121 falls within bandwidth C of low pass filter 122. Of course, as discussed above, it is understood that in various embodiments, the multi-tone signal generator 155 may be replaced by a multi-pulse generator as the LO signal generator, without departing from the scope of the present teachings. Also, as discussed above, the low pass filter 122 outputs a frequency compressed signal S'(t), which is digitized by analog-to-digital converter 123. The digitized signal includes both the phase and amplitude information needed to determine the phase and amplitude of the harmonics in the input signal S(t). Hence, a replica of the input signal S(t) can be provided by an inverse Fourier transform generated by the data processor 154. Results may be output and displayed on a display device, such as display 173.

Additionally, in order to function without a physical connection to the stimulus signal generator 141, the receiver 160 further includes second clock 153 and measurement memory 145, according to a representative embodiment. The second clock 153 is used to control operations of the various components within the receiver 160, including multi-tone signal generator 155 and the resampling clock. For example, the multi-tone signal generator 155 and the resampling clock may be run by clocks derived from the second clock 153. In various embodiments, the first and second clocks 143, 153 are not synchronized with one another. However, the first and second clocks 143, 153 must be syntonized with one another for producing the repetitive stimulus signal and LO signals, respectively, and coordinating property measurements. In other words, the second clock 153 must have the same frequency or must derive from the same frequency as the first clock 143. In an embodiment, the first and second clocks 143, 153 have a 10 MHz reference, or a multiple thereof. Also, each of the first and second clocks 143, 153 must be moderately accurate, having a clock accuracy of at least about 100 ppm, for example. However, highly accurate and/or universally synchronized clocks, such as atomic clocks, are not required.

The memory 145 is used to store at least results of calibration measurements of various properties using only the stimulus signal provided by the stimulus signal generator 141 (i.e., without the DUT 174) during a calibration period, prior to measuring these properties with respect to the DUT 174. More particularly, during the calibration period, the receiver 160 is connected directly to the stimulus signal generator 141 in order to receive the stimulus signal (e.g., through a calibration cable). Because the DUT 174 is not yet in place, the receiver 160 may be moved in close proximity to the stimulus signal generator 141, so that physical connections for both the stimulus signal and a trigger (as shown in FIG. 6) may be made between the stimulus signal generator and the receiver 160.

Generally, measurements of desired properties are made in this configuration during the calibration period, e.g., in the manner described above with regard to FIG. 6, and stored in memory 145. Then, the DUT 174 is connected between the stimulus signal generator 141 and the receiver 160, thus preventing the direct physical connections, and measurements of the same desired properties are repeated for the DUT 174. The measurements with the DUT 174 in place may then be compared with the calibration measurements previously stored in the memory 145, enabling determination of the corresponding properties of the DUT 174. Lack of synchronized timing is not a factor, since the first and second clocks 143, 153 are syntonized, as discussed above.

The process is discussed in more detail with reference to FIG. 10, which is a flow diagram illustrating a process for measuring properties of a device under test, according to another representative embodiment.

Figure 10:
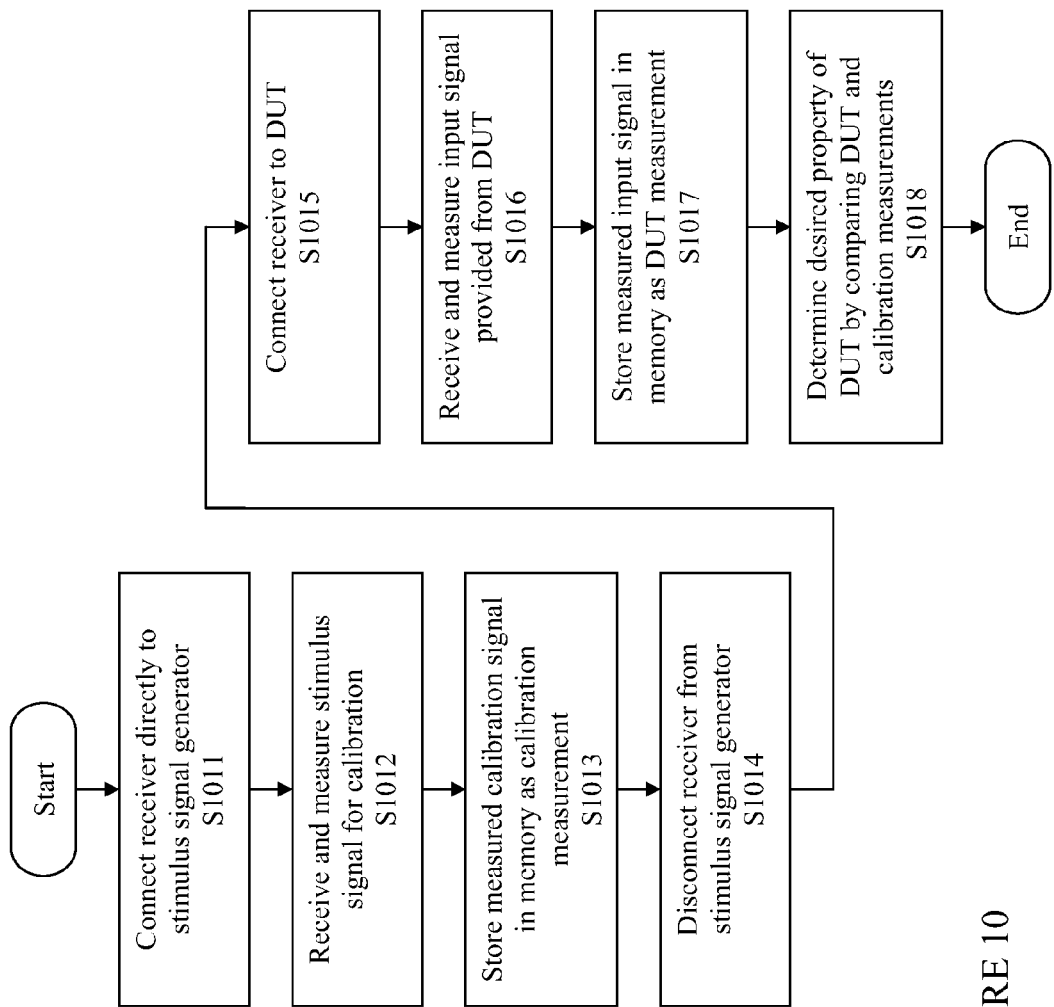
FIG. 10 is a flow diagram illustrating a process for measuring properties of a device under test, according to another representative embodiment.

In block S1011 of FIG. 10, the receiver 160 is connected directly to the stimulus signal generator 141 by a calibration cable (not shown) during a calibration period. The stimulus signal generator 141 provides a calibration stimulus signal modulated at a fundamental frequency. As discussed above, the calibration stimulus signal is a repetitive signal, such as a periodic PRBS signal, for example, although other types of repetitive signals may be incorporated. The calibration stimulus signal may be a broadband signal, e.g., which provides all frequencies to be measured at the same time, or a narrowband signal, without departing from the scope of the present teachings.

The receiver 160 receives and measures the calibration stimulus signal in block S1012. The calibration stimulus signal is measured based on processing that is substantially the same as discussed above with reference to sampling oscilloscope 60 in FIG. 6, without the DUT 74 being present. For example, input calibration signal $S_c(t)$ is mixed by mixer 121 with the LO signal generated by the multi-tone signal generator 155 to provide an IF signal within the bandwidth of low pass filter 122. The low pass filter 122 outputs compressed calibration signal $S_c'(t)$, which is digitized by analog-to-digital converter 123, the digitized calibration signal including phase and amplitude information needed to determine the phase and amplitude of the harmonics in the input calibration signal $S_c(t)$. The data processor 154 measures the digitized calibration signal, for example, by generating a Fourier transform of the digitized calibration signal and measuring amplitude and phase at each frequency. The frequency response of the calibration cable may be measured separately and its impact on the received signal properties may be removed, so that an accurate measurement of the digitized calibration signal is obtained. The measurement results are stored as calibration measurement in the memory 145, in block S1013. The calibration process being complete, the receiver 160 is disconnected from the stimulus signal generator 141 in block S1014.

In block S1015, the DUT 174 is connected to between the stimulus signal generator 141 and the receiver 160, beginning the DUT 174 measurement process. As stated above, there are no direct connections between the stimulus signal generator 141 and the receiver 160, e.g., due to the length and/or accessibility of the DUT 174. Therefore, there are no synchronization signals, such as a trigger or the clock signal generated by the first clock 143, passed from the stimulus signal generator 141 to the receiver 160. However, as stated above, the receiver includes the second clock 153, which is syntonized with the first clock 143 and can be used to control processing of stimulus response signals output by the DUT 174. In an embodiment, when syntonization is not guaranteed, due to frequency drift of the first and second clocks 143, 153 with temperature, for example, then a signal (tone) with a previously arranged frequency may be sent from the stimulus signal generator 141 through the DUT 174 to the receiver 160, and the receiver 160 may use the tone to verify and/or improve the syntonization of the second clock 153.

In block S1016, the receiver 160 receives and measures input signal S(t) provided by the DUT 174 in response to the stimulus signal provided by the stimulus signal generator 141, which may be a broadband or narrow band signal. The measurement of the input signal S(t) may be based on processing that is substantially the same as discussed above with reference to sampling oscilloscope 60 in FIG. 6, without the trigger connection. The input signal S(t) is mixed by mixer 121 with the LO signal generated by the multi-tone signal generator 155 to provide an IF signal within the bandwidth of low pass filter 122. The LO signal is derived from the second clock 153 and has a fundamental frequency slightly different from that of the stimulus signal generated by the stimulus signal generator 141. The amplitudes and phases of the harmonics in the LO signal are known. The fundamental frequencies are chosen such that each harmonic in the LO signal corresponds to one of the harmonics in the stimulus signal.

The low pass filter 122 receives the IF signal from the mixer 121 and outputs compressed signal S'(t), which is digitized by analog-to-digital converter 123, the digitized signal including phase and amplitude information needed to determine the phase and amplitude of the harmonics in the input signal S(t). The data processor 154 measures the digitized signal, for example, by Fourier transforming the digitized signal to a frequency-domain signal in a manner analogous to that discussed above. The measurement results (optionally) may be stored as DUT measurement in the memory 145 in block S1017.

In block S1018, the data processor 154 compares the measured digitized signal corresponding to the input signal S(t) with the (previously stored) measured digitized calibration signal corresponding to the input calibration signal $S_c(t)$ to determine one or more desired properties of DUT 174. For example, if the calibration signal $S_c(t)$ has a larger amplitude than the input signal $S(t)$, then the DUT 174 has loss. In an embodiment, the amplitude and phases of the harmonics of interest in the Fourier transformed measured signals are compared. Thus, the frequency response, $H(f)$, of the DUT 174 can be determined through this comparison according to the formula $H(f)=S(f)/S_c(f)$, where $f$ is the set of frequencies being measured.

Because the first and second clocks 143, 153 are syntonized and have sufficient accuracy, and because the calibration stimulus signal and the stimulus signal are the same repetitive signals, there is no need to actually synchronize the stimulus signal generator 141 and the receiver 160, e.g., to maintain a phase relationship. Also, because there is no need to sweep a large frequency range, as discussed above, the time for measuring the signal output by the DUT 174 is relatively short. The short measurement time mitigates errors that may occur due to slight mismatches in frequencies between the first clock 143 and the second clock 153. For example, the time needed to sweep a 20 GHz broadband stimulus signal is about 100 ms, while the time needed to measure the same harmonics of the same 20 GHz broadband stimulus signal according to the various embodiments could be only about 10 μs.

Accordingly, various properties of the DUT 174, such as frequency response (amplitude and phase), may be measured without synchronized communication between the stimulus signal generator 141 and the receiver 160. For example, group delay information may be obtained easily in the depicted embodiment by first determining the values of frequency response $H(f)$ at each measured frequency and then taking the derivative of the phase measurements with respect to frequency. Because the first and second clocks 143, 153 are not synchronized, the receiver 160 does not know the phase of the repetitive stimulus signal produced by stimulus signal generator 141 at any given time. Consequently, phase measurements of the input signal $S(t)$ have an ambiguous constant slope versus frequency. Thus, because the group delay is obtained through differentiating the phase measurement, the ambiguous phase slope mentioned above becomes an ambiguous constant offset to the group delay at each frequency, which can be neglected. Because of the ambiguous constant offset to the group delay, this method cannot determine the distance or time delay between the stimulus signal generator 141 and the receiver 160, and thus the length of the DUT 174. However, the length of the DUT 174 can be obtained by other means, and it is the relative group delay (time difference of arrival of various frequencies) that is particularly useful.

As discussed above, to accurately measure a received broadband stimulus signal, the second clock 153 must be syntonized to the first clock 143. Otherwise, errors occur as the repetitive signal is sampled (and averaged) with samples at varying and unequal time-spacing. Inexpensive yet sufficient stable clocks exist that are suitable for this purposed. In various embodiments, the first and second clocks 143, 153 may be syntonized and/or syntonization may be verified through the DUT 174. In other words, a suitable clock tone may be passed through the DUT 174 and received by the receiver 160, which may analyze the clock tone and determine if the second clock 153 is syntonized with the first clock 143, or otherwise requires tuning.

Generally, measuring the frequency response, including S-parameters, of DUTs having ports separated by long distances is difficult, expensive and often results in poor measurement quality. According to various embodiments, measurements of S-parameters for such DUTs are performed at higher frequencies than are possible using traditional oscilloscopes, and at significantly lower cost than using high-speed oscilloscopes. There is no need for long cables connecting the distant port of the DUT back to the instrument generating the stimulus signal. Also, in MIMO channel sounding, for example, no atomic clocks are needed to maintain a phase relationship between the instrument generating the stimulus signal and the instrument receiving the DUT output and performing the measurements.

According to the embodiments discussed above, a broadband stimulus signal may be used to determine various properties of a DUT, including frequency response. One advantage of using a broadband stimulus signal is that power is distributed over a range of frequencies, such that spectral power density is relatively low compared to a stimulus signal in which all of the power is present in a single tone at any given time. Thus, measurements of a dynamic range may be obtained with less spectral power density than required in conventional network analyzers, for example.

More particularly, the stimulus signal provided to the DUT by a conventional network analyzer is typically generated by a swept or step tunable oscillator, as discussed above. For example, to measure the band between 2 GHz and 4 GHz, a conventional network analyzer may sequentially provide a single frequency (or tone) having a 1 ms duration to each of 201 equally spaced frequency points across the 2 GHz to 4 GHz range. The number of frequency points corresponds to the resolution of the measurement. The DUT then reflects or transmits (depending on the measurement setup) a signal in response to this stimulus signal, which is measured by the network analyzer. The entire measurement range can be covered in about 0.2 second. However, the power at each frequency point would be the full power of the stimulus signal.

Such a conventional approach applying a sequentially tuned (or step tuned) stimulus signal cannot be used or is limiting for some applications in which the power at each frequency is restricted. For example, medical applications involving microwave imaging techniques require antennas to transmit and receive signals. In a hospital or other facility, these signals are restricted by the Federal Communications Commission (FCC), e.g., by part 15 of the FCC rules regarding requirements for medical imaging devices, to avoid interference with other signals and devices. Also, some applications require or would otherwise benefit from monitoring frequency response of a system, such as cable or cellular base-station, while the system is in use. A strong sequentially tuned frequency stimulus signal, as employed by conventional network analyzers, would disrupt normal operation of the system during the measuring process. Therefore, a sequentially tuned network analyzer is not a good fit for such applications.

Figure 11:
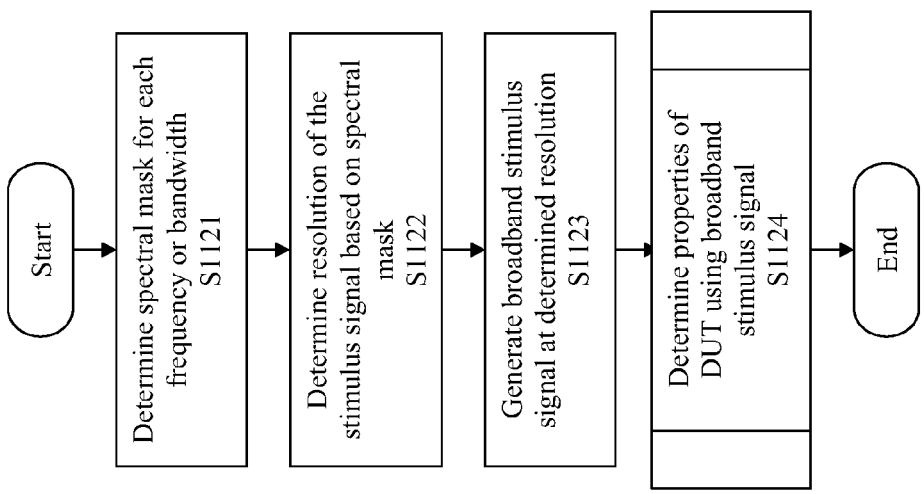
FIG. 11 is a flow diagram illustrating a process for adjusting power for measuring properties of a device under test, according to another representative embodiment.

FIG. 11 is a flow diagram illustrating a process for adjusting power for measuring properties of a DUT within a predetermined power limit, according to a representative embodiment. The illustrative process depicted in FIG. 11 may be implemented, for example, using a network analyzer, such as network analyzer 40 discussed above with reference to FIG. 5.

Referring to FIG. 11 a spectral mask corresponding to each frequency or bandwidth is determined in block 1121. The spectral mask is effectively the maximum power for the frequency or bandwidth. For example, the spectral mask may be intended to avoid interference between the stimulus signal (e.g., provided by stimulus signal generator 41) and other transmission signals in close relative proximity to the network analyzer. The spectral mask may be imposed by regulation or may be determined empirically, for example, to avoid signal interference. Similarly, the spectral mask may correspond to the noise floor of a (wireless) communication network, below which signals at a particular frequency will not interfere with ongoing transmissions.

In block S1122, resolution of the stimulus signal is determined, such that the power at any one spectral band is less than the upper power limit. The resolution of the stimulus signal is a function of the repetition rate of the stimulus signal, such as a periodic PRBS signal. The higher the repetition rate, the less the power at each frequency or bandwidth. For example, an illustrative broadband stimulus signal covers a frequency range from 2 GHz-4 GHz. At a resolution of 50 MHz, there are 40 distinct frequencies, which correspond to harmonics of the broadband stimulus signal or comb lines on the network analyzer display. The power at each frequency is effectively about $1/40^{th}$ of the total power of the stimulus signal. At a resolution of 1 MHz, there are 2,000 distinct frequencies, each having a corresponding power of about $1/2,000^{th}$ of the total power of the stimulus signal.

A broadband stimulus signal is generated in block S1123 at the determined resolution and applied to a DUT (e.g., DUT 42 in FIG. 5). The frequency response and/or other properties of the DUT may then be measured for each frequency or bandwidth according to the various embodiments discussed above, indicted by the process depicted by block S1124, depending on the type of DUT and the configuration of the network analyzer. As discussed above, the power corresponding to each frequency or bandwidth of the broadband stimulus signal is less than the spectral mask determined in block S1121, while the overall power of the stimulus signal remains the same.

Accordingly, power levels at the various distinct frequencies or bandwidths in the broadband stimulus signal provided by the network analyzer are acceptable, thus avoiding interference with other signals. For example, in the case an FCC spectral mask applies to operation of a medical imaging device, the network analyzer spreads the energy of the broadband stimulus signal over a sufficient number of tones or over a sufficiently broad range to comply with the spectral mask. Also, with respect to in-service testing and monitoring of an active DUT, such as a cable, a wireless communication link, or other system, the broadband stimulus signal operates beneath the associated noise floor. Thus, even with data propagating through the DUT, a sufficient amount of averaging enables accurate measurements, even below the noise floor. Likewise, antenna ranges benefit from avoiding or reducing licensing requirements by employing broadband stimulus signals to reduce spread out the power, rather than sequentially tuned single-frequency stimulus signals.

While specific embodiments are disclosed herein, many variations are possible, which remain within the concept and scope of the invention. Such variations would become clear after inspection of the specification, drawings and claims herein. The invention therefore is not to be restricted except within the scope of the appended claims.

What is claimed is:

1. A system for measuring a property of a device under test (DUT), the system comprising:
   a stimulus signal generator configured to generate a repetitive stimulus signal under control of a first clock, and to provide the stimulus signal to an input port of the DUT; and
   a receiver configured to receive an input signal from an output port of the DUT, the input signal being based on the stimulus signal provided to the input port of the DUT, the receiver comprising:
      a second clock syntonized with the first clock, such that a second frequency of the second clock is the same as or derives from a first frequency of the first clock without synchronizing to the first clock;
      a memory configured to store a calibration measurement of a calibration stimulus signal provided to the receiver during a calibration period without the DUT being connected to the stimulus signal generator; and
      a data processor configured to determine the property of the DUT based on the stored calibration measurement and a measurement of the input signal from the DUT performed under control of the second clock.

2. The system of claim 1, wherein the repetitive stimulus signal comprises a periodic pseudo-random binary sequence (PRBS).

3. The system of claim 2, wherein the repetitive stimulus signal comprises a broadband signal.

4. The system of claim 1, wherein the receiver further comprises:
   a local oscillator (LO) signal generator configured to generate an LO signal under control of the second clock;
   a mixer configured to mix the LO signal and the input signal from the DUT to provide a mixed signal;
   a low-pass filter configured to filter the mixed signal to provide a frequency compressed signal; and
   an analog-to-digital converter (ADC) configured to digitize the frequency compressed signal to provide a digitized signal to the data processor.

5. The system of claim 4, wherein the data processor is further configured to perform a Fourier transform on the digitized signal from the ADC, obtaining frequency domain information of the input signal without requiring separate measurement of individual frequency components in input signal.

6. The system of claim 1, wherein the data processor is further configured to verify that the first and second clocks are syntonized based on a clock tone from the stimulus signal generator passed through the DUT.

7. The system of claim 1, wherein the property of the DUT determined by the data processor comprises a time-varying S-parameter.

8. The system of claim 7, wherein the at least one time varying S-parameter comprises an S21 parameter.

9. The system of claim 4, wherein the stimulus signal comprises harmonics including a highest harmonic of interest, the harmonics comprising a fundamental frequency and one or more higher frequency harmonics, each of the harmonics being characterized by an amplitude and phase, and wherein the LO signal comprises harmonics corresponding to the harmonics of the repetitive stimulus signal.

10. The system of claim 4, wherein the LO signal generator comprises a multi-tone signal generator.

11. The system of claim 4, wherein the LO signal generator comprises a multi-pulse signal generator.

12. The system of claim 1, wherein the receiver is connected to the stimulus signal generator through a calibration cable to receive the calibration stimulus signal during the calibration period to perform the calibration measurement under control of the first clock.

13. The system of claim 12, wherein the receiver is disconnected from the calibration cable after the calibration period and connected to the output port of the DUT to receive the input signal.

14. A method for measuring a property of a device under test (DUT) using a repetitive stimulus signal, the method comprising:
   receiving a calibration stimulus signal directly from a stimulus signal generator through a calibration cable during a calibration period, the stimulus signal generator generating the calibration stimulus signal under control of a first clock;

measuring the received calibration stimulus signal; and storing the measured calibration stimulus signal;

disconnecting from the calibration cable and the stimulus signal generator, and connecting to an output of the DUT;

receiving an input signal from the output of the DUT in response to the DUT receiving the stimulus signal from the stimulus signal generator, the stimulus signal generator generating the stimulus signal under control of the first clock;

measuring the received input signal under control of a second clock that is not synchronized with the first clock; and determining the property of the DUT based on the measured input signal and the stored measured calibration stimulus signal.

15. The method of claim 14, wherein the second clock is syntonized with the first clock.

16. The method of claim 14, wherein each of the calibration stimulus signal and the stimulus signal comprises a periodic pseudo-random binary sequence (PRBS).

17. The method of claim 16, wherein each of the calibration stimulus signal and the stimulus signal comprises a broadband signal that provides all frequencies to be measured at the same time.

18. A method of testing a device under test (DUT) using a repetitive broadband stimulus signal having a plurality of harmonics, the method comprising:

determining a resolution of the broadband stimulus signal based on a spectral mask limiting power corresponding to each of the plurality of harmonics, the resolution corresponding to a rate of repetition of the broadband stimulus signal;

applying the broadband stimulus signal having the determined resolution to the DUT;

receiving an input signal from the DUT in response to the applied broadband stimulus signal;

generating a periodic local oscillator (LO) signal;

mixing the LO signal with the input signal to create an intermediate frequency (IF) signal; and filtering the IF signal to provide a frequency-compressed signal comprising a plurality of harmonics, each of which corresponds to one of the plurality of harmonics in the input signal and has an amplitude related to an amplitude of the corresponding harmonic in the input signal, at least one frequency component in the filtered IF signal differing in amplitude or phase from a frequency component in the corresponding harmonic in the input signal, wherein power associated with each of the plurality of harmonics of the broadband stimulus signal is below the spectral mask.

19. The system of claim 1, wherein the calibration measurement of the calibration stimulus signal is performed using a frequency compressed calibration signal corresponding to the calibration stimulus signal, and the measurement of the input signal is performed using a frequency compressed signal corresponding to the input signal.

20. The system of claim 19, wherein the frequency compressed calibration signal has one harmonic corresponding to each harmonic in the calibration stimulus signal, and the frequency compressed signal has one harmonic corresponding to each harmonic in input signal.

* * * * *